United States Patent
Passlack et al.

[11] Patent Number: 6,094,295
[45] Date of Patent: Jul. 25, 2000

[54] ULTRAVIOLET TRANSMITTING OXIDE WITH METALLIC OXIDE PHASE AND METHOD OF FABRICATION

[75] Inventors: Matthias Passlack, Chandler; Jonathan Kwadwo Abrokwah, Tempe; Zhiyi Jimmy Yu, Gilbert, all of Ariz.

[73] Assignee: Motorola, Inc., Schaumburg, Ill.

[21] Appl. No.: 09/022,703

[22] Filed: Feb. 12, 1998

[51] Int. Cl.$^7$ ............... G02F 1/00; B05D 3/06; H01L 21/31; H01L 29/94

[52] U.S. Cl. ........... 359/321; 427/567; 427/596; 438/779; 257/289

[58] Field of Search ................... 427/566, 567, 427/596; 438/769, 779; 257/289; 359/273, 321

[56] References Cited

U.S. PATENT DOCUMENTS

| | | | |
|---|---|---|---|
| 5,124,762 | 6/1992 | Childs et al. | 357/16 |
| 5,451,548 | 9/1995 | Hunt et al. | 437/225 |
| 5,550,089 | 8/1996 | Dutta et al. | 437/225 |
| 5,597,768 | 1/1997 | Passlack et al. | 437/236 |
| 5,622,653 | 4/1997 | Orita et al. | 252/518 |
| 5,665,658 | 9/1997 | Passlack | 438/763 |

FOREIGN PATENT DOCUMENTS 8-277116  10/1996  Japan .

OTHER PUBLICATIONS

An article entitled "Thermodynamic and photochemical stability of low interface state density $Ga_2O_3$–GaAs structures fabricated by in situ molecular beam epitaxy" from Appl. Phys. Lett. 69(3), M. Passlack et al., pp. 302–304 (Jul. 15, 1996).

An article entitled "Recombination velocity at oxide–GaAs interfaces fabricated by in situ molecular beam epitaxy" from Appl. Phys. Lett. 68(25), M. Passlack et al., pp. 3605–3607, (Jun. 17, 1996).

An article entitled "Quasistatic and high frequency capacitance–voltage characterization of $Ga_2O_3$–GaAs structures fabricated by in situ molecular beam epitaxy" from Appl. Phys. Lett. vol. 68, No. 8, M. Paasalck et al., pp. 1099–1101 (Feb. 19, 1996).

An article entitled "Anisotropy of electrical and optical properties in B–$Ga_2O_3$ single crystals " from Appl. Phys. Lett. 71(7), N. Ueda et al., pp. 933–935 (Aug. 18, 1997).

An article entitled "Synthesis and control of conductivity of ultraviolet transmitting B–$Ga_2O_3$ single crystals" from Appl. Phys. Lett. 70(26), N. Ueda, pp. 3561–3563 (Jun. 30, 1997).

*Primary Examiner*—Georgia Epps
*Assistant Examiner*—David N. Spector
*Attorney, Agent, or Firm*—Gregory J. Gorrie

[57] ABSTRACT

An electro-conductive ultraviolet light transmitting $Ga_2O_3$ material (10) with a metallic oxide phase is deposited on a GaAs substrate or supporting structure (12). The $Ga_2O_3$ material or thin layer comprises a minor component of metallic $IrO_2$. The $Ga_2O_3$ thin layer may be positioned using thermal evaporation (106) of $Ga_2O_3$ or of a $Ga_2O_3$ containing a compound from an Iridium crucible (108). Alternatively, the Ir may be co-evaporated (110) by electron beam evaporation. The electro-conductive ultraviolet light transmitting material $Ga_2O_3$ with a metallic oxide phase is suitable for use on solar cells and in laser lithography.

12 Claims, 2 Drawing Sheets

ULTRAVIOLET TRANSMITTING OXIDE WITH METALLIC OXIDE PHASE AND METHOD OF FABRICATION

FIELD OF THE INVENTION

The present invention pertains to electro-conductive ultraviolet light transmitting oxide layers and more specifically to ultraviolet transmitting $Ga_2O_3$ layers comprising a minor component of metallic $IrO_2$ and methods of fabrication.

BACKGROUND OF THE INVENTION

Transparent electro-conductive oxides are widely used as electrodes for solar cells and flat panel displays. In particular, $In_2O_3$:Sn (ITO) which is manufactured with a specific conductivity as high as $10^4$ $\Omega^{-1}$ $cm^{-1}$, has found widespread use in various applications. Other commonly used transparent electro-conductive oxides include ZnO:Al, $SnO_2$:Sb, and $SnO_2$:F. Typically, the electrical conductivity is controlled using substitutional doping. All the aforementioned oxides have a band gap below 4 eV and thus, can not transmit ultraviolet light. Advanced technologies such as laser lithography and highly efficient solar cells, however, require electro-conductive ultraviolet light transmitting materials, and in particular, thin layers of such electro-conductive ultraviolet light transmitting materials.

For electro-conductive ultraviolet light transmitting materials, see for instance N. Ueda et al., Appl. Phys. Lett., 70, 3561 (1997) and N. Ueda et al., Appl. Phys. Lett., 71, 933 (1997), reported the use of $ZnGa_2O_4$ and of single crystals of $\beta$-$Ga_2O_3$. $ZnGa_2O_4$ has a band gap of 5.2 eV, however, only sintered samples were successfully doped. On the other hand, $\beta$-$Ga_2O_3$ has a band gap of 4.79 and 4.52 eV along the b and c axis of the crystal, respectively, and the band gap along the b axis increases to 5.1 eV due to band gap widening with increasing carrier concentrations. The conductivity of the $Ga_2O_3$ crystal is controlled by changing the growth atmosphere or using substitutional $Sn^{4+}$ doping; conductivities as high as 38 $\Omega^{-1}$ $cm^{-1}$ were reported.

At present, there are no methods of successfully manufacturing electro-conductive ultraviolet light transmitting thin layers. These are pivotal for advanced technologies such as laser lithography and highly efficient solar cells. Also, the introduction of donors into wide band gap materials (>4 eV) is in general very difficult.

Thus what is needed is a new and improved electroconductive ultraviolet light transmitting material and method of fabrication which help overcome these problems. What is also needed is a new and improved electro-conductive ultraviolet light transmitting material. What is also needed is a new and improved electro-conductive ultraviolet light transmitting $Ga_2O_3$ material with a metallic oxide phase. What is also needed is a new and improved electro-conductive ultraviolet light transmitting $Ga_2O_3$ material comprising a minor component of metallic $IrO_2$. What is also needed is a new and improved electro-conductive ultraviolet light transmitting thin oxide layer. What is also needed is a new and improved electro-conductive ultraviolet light transmitting thin oxide layer which is compatible with standard micro-electronics and opto-electronic devices and structures. What is also needed is a new and improved electro-conductive ultraviolet light transmitting thin oxide layer for advanced laser lithography and highly efficient solar cells applications. What is also needed is a new and improved electro-conductive ultraviolet light transmitting thin $Ga_2O_3$ layer with a metallic oxide phase. What is also needed is a new and improved electro-conductive ultraviolet light transmitting thin $Ga_2O_3$ layer comprising a minor component of metallic $IrO_2$. What is also needed is a new and improved method of manufacturing an electroconductive ultraviolet light transmitting $Ga_2O_3$ material or thin layer using thermal evaporation of $Ga_2O_3$ or of a $Ga_2O_3$ containing compound from a metal crucible. What is also needed is a new and improved method of manufacturing an electro-conductive ultraviolet light transmitting $Ga_2O_3$ material or thin layer wherein the crucible comprises Ir.

What is also needed is a new and improved method of manufacturing an electro-conductive ultraviolet light transmitting $Ga_2O_3$ material or thin layer using co-evaporation of a metal. What is also needed is a new and improved method of manufacturing an electro-conductive ultraviolet light transmitting $Ga_2O_3$ material or thin layer using co-evaporation of Ir. What is also needed is a new and improved method of manufacturing an electro-conductive ultraviolet light transmitting $Ga_2O_3$ material or thin layer which is compatible with standard micro-electronics and opto-electronic device manufacturing. What is also needed is a new and improved electro-conductive ultraviolet light transmitting material which is relatively easy to fabricate and use.

BRIEF DESCRIPTION OF THE DRAWINGS

The invention is pointed out with particularity in the appended claims. However, a more complete understanding of the present invention may be derived by referring to the detailed description and claims when considered in connection with the figures, wherein like reference numbers refer to similar items throughout the figures, and:

The exemplification set out herein illustrates a preferred embodiment of the invention in one form thereof, and such exemplification is not intended to be construed as limiting in any manner.

DESCRIPTION OF THE PREFERRED EMBODIMENT

The present invention provides, among other things, an electro-conductive ultraviolet light transmitting $Ga_2O_3$ material or thin layer with a metallic oxide phase. In a preferred embodiment, the electro-conductive ultraviolet light transmitting $Ga_2O_3$ material or thin layer includes a minor component of metallic $IrO_2$. In one embodiment, an electro-conductive ultraviolet light transmitting $Ga_2O_3$ thin layer is deposited on a supporting structure using thermal evaporation of $Ga_2O_3$ or of a $Ga_2O_3$ containing compound from an Ir crucible. In another embodiment, an electro-conductive ultraviolet light transmitting $Ga_2O_3$ thin layer is deposited on a supporting structure using thermal evaporation of $Ga_2O_3$ or of a $Ga_2O_3$ containing compound and Ir co-evaporation.

Figure 1:
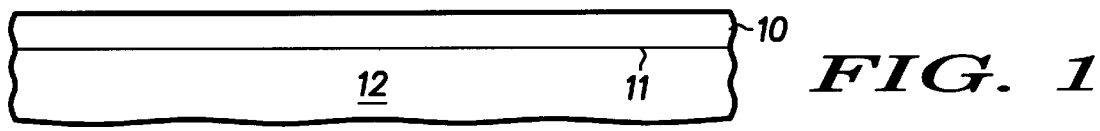
FIG. 1 is a simplified cross sectional view of an electro-conductive ultraviolet light transmitting $Ga_2O_3$ thin layer positioned on a supporting structure in accordance with a preferred embodiment of the present invention.

FIG. 1 is a simplified cross sectional view of an electro-conductive ultraviolet light transmitting $Ga_2O_3$ thin layer 10 positioned on upper surface 11 of a supporting structure in accordance with a preferred embodiment of the present invention. $Ga_2O_3$ layer 10 comprises a metallic oxide phase. The supporting structure 12 includes a layer or a layer structure comprising any material employed in microelectronics manufacturing. Preferably, structure 12 is a GaAs wafer. In a specific embodiment, supporting structure 12 comprises any layer or layer structure employed in solar cells. In a preferred embodiment, the electro-conductive ultraviolet light transmitting $Ga_2O_3$ thin layer is deposited on a supporting structure using thermal evaporation of $Ga_2O_3$ or of a $Ga_2O_3$ containing compound.

Figure 2:
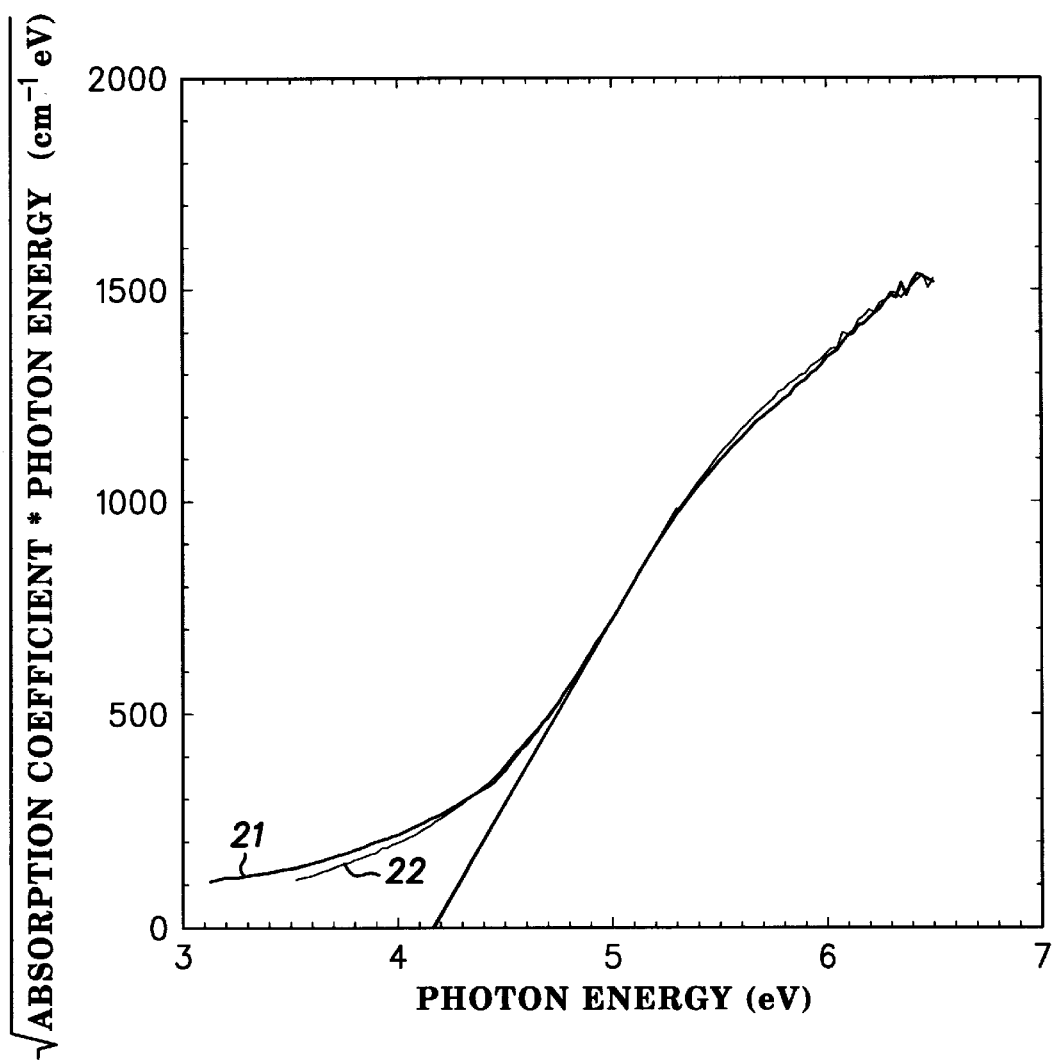
FIG. 2 is a graph illustrating the measured optical band gap of a $Ga_2O_3$ thin layer positioned on a supporting GaAs semiconductor wafer in accordance with a preferred embodiment of the present invention.

FIG. 2 is a graph illustrating the measured optical band gap of a $Ga_2O_3$ thin layer positioned on a supporting GaAs semiconductor wafer in accordance with a preferred embodiment of the present invention. In FIG. 2, a Tauc plot illustrates the optical absorption coefficient as a function of photon energy for $Ga_2O_3$ thin layers. Curves 21 and 22 depict the measured absorption coefficient of a 389 and 855 Å thick $Ga_2O_3$ layer with an optical band gap $E_G$ of 4.16 and 4.17 eV respectively. Note that the optical transmission for a 1000 Å $Ga_2O_3$ layer is 64% and 35% at typical ultraviolet lines used for laser lithography of 266 nm and 248 nm, respectively. Ts is 440° C.

In a specific example, an electro-conductive ultraviolet light transmitting $Ga_2O_3$ thin layer is deposited on a supporting structure using thermal evaporation of $Ga_2O_3$ or of a $Ga_2O_3$ containing compound from an Ir crucible. The Ir partial vapor pressure of $\cong 5 \times 10-7$ Torr occurring at a typical temperature for $Ga_2O_3$ evaporation of 1700° C. generally results in an Ir concentration of $\cong 5 \times 10^{18}$ cm$^{-3}$ in the deposited $Ga_2O_3$ thin layer.

Figure 3:
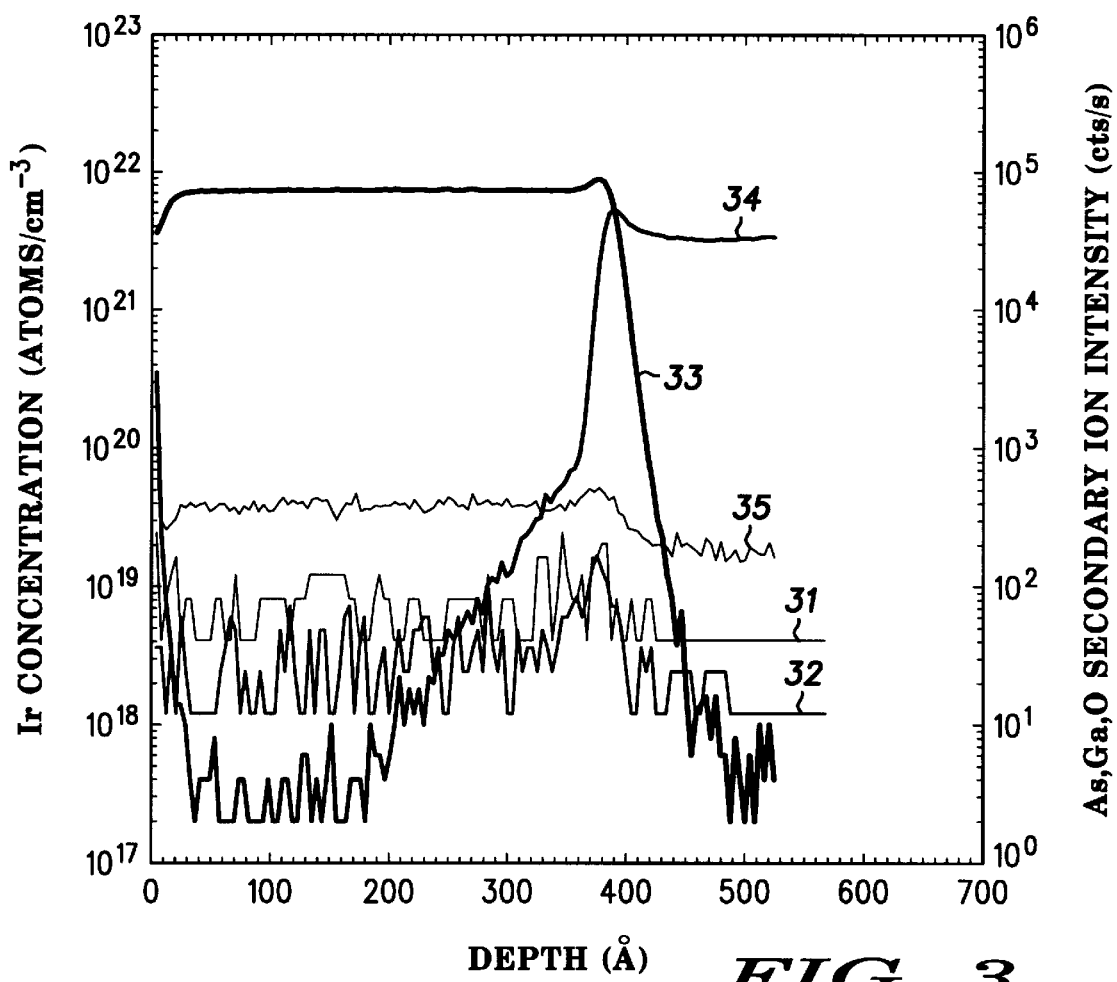
FIG. 3 is a graph illustrating the measured Ir concentration in a $Ga_2O_3$ thin layer positioned on a supporting GaAs semiconductor wafer in accordance with a preferred embodiment of the present invention.

FIG. 3 is a graph illustrating the measured Ir concentration in a $Ga_2O_3$ thin layer positioned on a supporting GaAs semiconductor wafer in accordance with a preferred embodiment of the present invention. In FIG. 3, curves 31 and 32 depict the selective ion mass spectroscopy (SIMS) depth profiles for $Ir^{191}$ and $Ir^{193}$, respectively, of a $Ga_2O_3$ thin layer deposited on a supporting structure in accordance with the invention. FIG. 3 also shows the SIMS depth profiles of oxygen 33, As 34, and Ga 35. The $Ga_2O_3$ layer is 393 Å thick.

Typically, the supporting structure 12 is held at an elevated temperature during deposition of the $Ga_2O_3$ layer 10 fabricated in accordance with the invention. Energetically, the oxidation of Ir is favored at such temperatures and Ir is incorporated in its oxidized state ($IrO_2$) into the $Ga_2O_3$ layer 10; for example the Gibbs free energy of oxidation for Ir is −29.4 kcal/mol at 400° C. Since $IrO_2$ exhibits metallic conductivity at room temperature with $\sigma > 10^4$ $\Omega^{-1}$ cm$^{-1}$, a component of metallic conductivity is introduced into the $Ga_2O_3$ layer. Using an Ir crucible in accordance with the invention, electro-conductive $Ga_2O_3$ layers with a thickness in between 50 and 1100 Å have been fabricated and a conductivity of up to $10^{-2}$ $\Omega^{-1}$ cm$^{-1}$ has been measured. Further increase of the Ir concentration using, for example, a higher crucible temperature or co-evaporation of Ir or any other metal forming a conducting oxide will significantly increase the conductivity into the 100 $\Omega^{-1}$ cm$^{-1}$ range. For example, co-evaporation could be accomplished using electron beam evaporation or other techniques.

Figure 4:
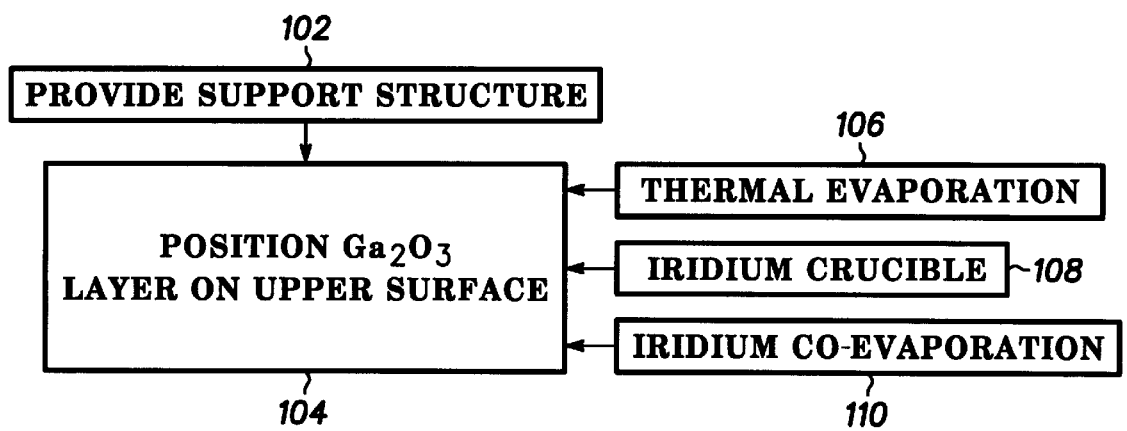
FIG. 4 is a simplified flow chart describing a method of manufacturing an electro-conductive ultraviolet light transmitting oxide layer in accordance with a preferred embodiment of the present invention.

FIG. 4 is a simplified flow chart describing a method of manufacturing an electro-conductive ultraviolet light transmitting oxide layer in accordance with a preferred embodiment of the present invention. In task 102, a supporting structure having an upper surface is provided. In task 104, a $Ga_2O_3$ layer is positioned on an upper surface of a supporting structure. In the preferred embodiment, the $Ga_2O_3$ layer comprises a minor oxide component of metallic conductivity. Preferably, the minor oxide component is iridium oxide ($IrO_2$).

In one embodiment, the $Ga_2O_3$ containing compound is thermally evaporated 106 from a metal crucible 108. In a preferred embodiment, the metal crucible comprises Ir. In another embodiment, the method includes the steps of thermally evaporating an ultraviolet light transmitting $Ga_2O_3$ layer and co-evaporation 110 of Ir. The co-evaporation of Ir is preferably accomplished by electron beam evaporation.

Thus a new and improved electro-conductive ultraviolet light transmitting material and thin layer comprising a metallic oxide phase and methods of fabrication are disclosed. The electro-conductive ultraviolet light transmitting $Ga_2O_3$ material or thin layer is fabricated using thermal evaporation of $Ga_2O_3$ or of a $Ga_2O_3$ containing compound from a metal crucible. In a specific example, thermal evaporation from an Ir crucible introduces a minor metallic $IrO_2$ component into the $Ga_2O_3$ thin layer. Co-evaporation of Ir using electron beam evaporation or other techniques can also be applied. The invention is compatible with standard micro-electronic and opto-electronic device manufacturing. In a preferred embodiment, electro-conductive ultraviolet light transmitting thin layers are employed in advanced laser lithography and highly efficient solar cells.

As will be apparent to those skilled in the art, various changes and modifications may be made to the above-described embodiment without departing from the spirit or scope of the invention. It is intended that the invention be limited not by the illustrative embodiment, but be limited only by the scope of the claims appended hereto.

What is claimed is:

1. An electro-conductive ultraviolet light transmitting oxide comprising:

an ultraviolet light transmitting $Ga_2O_3$ as a major component; and an iridium oxide of metallic conductivity as a minor component.

2. An electro-conductive ultraviolet light transmitting oxide layer positioned on an upper surface of a supporting structure comprising:

an ultraviolet light transmitting $Ga_2O_3$ as a major component; and an iridium oxide of metallic conductivity as a minor component.

3. An electro-conductive ultraviolet light transmitting oxide layer according to claim 2 wherein the electro-conductive ultraviolet light transmitting oxide layer is positioned on a GaAs wafer.

4. An electro-conductive ultraviolet light transmitting oxide layer according to claim 2 wherein the electro-conductive ultraviolet light transmitting oxide layer is positioned on a supporting substrate comprising a solar cell.

5. A method of manufacturing an electro-conductive ultraviolet light transmitting oxide layer including:

providing a supporting substrate having an upper surface; and positioning an ultraviolet light transmitting $Ga_2O_3$ layer comprising a minor iridium oxide component of metallic conductivity on an upper surface of the supporting structure.

6. A method of manufacturing an electro-conductive ultraviolet light transmitting oxide layer according to claim 5 wherein positioning the electroconductive ultraviolet light transmitting $Ga_2O_3$ layer includes thermally evaporating $Ga_2O_3$ or a $Ga_2O_3$ containing compound using a metal crucible.

7. A method of manufacturing an electro-conductive ultraviolet light transmitting oxide layer according to claim 5 wherein positioning the electro-conductive ultraviolet light transmitting $Ga_2O_3$ layer includes thermally evaporating $Ga_2O_3$ or a $Ga_2O_3$ containing compound using a metal crucible containing Ir.

8. A method of manufacturing an electro-conductive ultraviolet light transmitting oxide layer according to claim 5 wherein positioning the electro-conductive ultraviolet light transmitting $Ga_2O_3$ layer includes thermally evaporating $Ga_2O_3$ or a $Ga_2O_3$ containing compound and co-evaporating Ir.

9. A method of manufacturing an electro-conductive ultraviolet light transmitting oxide layer according to claim wherein the step of co-evaporation of Ir is accomplished by electron beam evaporation.

10. A method of manufacturing an electro-conductive ultraviolet light transmitting oxide layer comprising:

providing a supporting substrate having an upper surface;

thermally evaporating from a $Ga_2O_3$ source or a $Ga_2O_3$ containing compound source onto the upper surface; and evaporating Ir onto the upper surface.

11. A method as claimed in claim 10 wherein thermally evaporating from a $Ga_2O_3$ source or a $Ga_2O_3$ containing compound source comprises thermally evaporating $Ga_2O_3$ or a $Ga_2O_3$ containing compound from an Ir crucible.

12. A method as claimed in claim 10 wherein evaporating Ir includes using electron beam evaporation.

* * * * *

UNITED STATES PATENT AND TRADEMARK OFFICE
CERTIFICATE OF CORRECTION

PATENT NO. : 6,094,295
DATED : July 25, 2000
INVENTOR(S) : Matthias Passlack et al.

It is certified that error appears in the above-identified patent and that said Letters Patent is hereby corrected as shown below:

<u>Column 5,</u>
Line 20, after "claim" add -- 8 --.

Signed and Sealed this

Twenty-first Day of May, 2002

Attest:

JAMES E. ROGAN
*Attesting Officer*   *Director of the United States Patent and Trademark Office*